(12) United States Patent
Fulkerson

(10) Patent No.: US 6,362,659 B1
(45) Date of Patent: Mar. 26, 2002

(54) DOMINO LOGIC FAMILY

(75) Inventor: David E. Fulkerson, Chanhassen, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/519,983

(22) Filed: Mar. 7, 2000

(51) Int. Cl.[7] .......................................... H03K 19/0948
(52) U.S. Cl. ........................ 326/121; 326/98; 326/112
(58) Field of Search ............................ 326/93–98, 112, 326/119, 121

(56) References Cited

U.S. PATENT DOCUMENTS

| | | | | |
|---|---|---|---|---|
| 5,541,537 A | * | 7/1996 | Kim et al. ................... | 326/121 |
| 5,825,208 A | | 10/1998 | Levy et al. .................... | 326/98 |
| 5,859,547 A | * | 1/1999 | Tran et al. ................... | 326/121 |
| 5,892,372 A | | 4/1999 | Ciraula et al. ................. | 326/96 |
| 6,133,759 A | * | 10/2000 | Beck et al. .................. | 326/121 |

OTHER PUBLICATIONS

Krambeck et al., "High–Speed Compact Circuits with CMOS", *IEEE Journal of Solid State Circuits,* vol. SC–17, No. 3, Jun. 1982, pp. 614–619.
Bernstein et al., *High Speed CMOS Design Styles,* dated prior to Mar. 7, 2000, Chapter 3, pp. 91–124.

* cited by examiner

*Primary Examiner*—Michael Tokar
*Assistant Examiner*—Don Phu Le

(57) ABSTRACT

A domino logic circuit and circuit family is disclosed that has reduced the capacitance on the evaluation node for increased performance. The domino logic circuit preferably includes an inverter, a pre-charge transistor, a logic block, and a pre-charge control transistor. One or both of the clocked transistors of conventional domino logic circuits are removed, and a single clocked transistor that controls the logic state of the output of the inverter is provided. This arrangement reduces or eliminates the series resistance in line with the logic block, reduces or eliminates the capacitance contributed by the clocked pre-charge transistor of conventional domino logic circuits, and reduces the size and thus the capacitance contributed by one or more of the transistor of the inverter.

7 Claims, 8 Drawing Sheets

DOMINO LOGIC FAMILY

BACKGROUND OF THE INVENTION

The present invention generally relates to digital logic families, and more particularly, to domino logic families for high speed circuits.

In general, the term "domino logic" is used to refer to an arrangement of logic circuit stages that may, for example, be cascaded together in an integrated circuit array configuration. A signal may be input to a first stage where it is evaluated in order to provide an output signal to a second stage where that output signal is again evaluated to provide an output signal for propagation to and evaluation by yet another stage in the circuit. Thus, a "domino" effect is achieved whereby signals are sequentially propagated through an array of "stages" or "domino blocks", and each successive stage performs an evaluation of an input condition until a final output is provided at a final output stage.

Domino logic circuits may be arranged so that signals can propagate through the various stages without being separately clocked at each stage. Accordingly, a domino arrangement allows a signal to be processed through a relatively complex logic function during a single clock cycle. This ability of a domino circuit obviates the need for plural clock cycles to process the input signals, and also decreases the overall processing time of the logic function. Conventional domino logic circuits are discussed in "High-Speed Compact Circuits with CMOS", Krambeck et al., IEEE *Journal of Solid-State Circuits,* Vol. SC-17, No. 3, June 1982, pp. 614–619, and "High-Speed CMOS Design Styles", Kluwer Academic Publishers, Boston, 1998, pp. 93–98.

A conventional domino logic OR gate is shown in FIG. 1. The OR gate includes PMOS transistors 10, 12, and 14, NMOS transistors 16 and 18, and logic block 20. PMOS transistor 12 and NMOS transistor 16 are arranged to form a conventional CMOS inverter having an input 22 and an output 24. The input 22 corresponds to an internal or evaluation node within the circuit. The gate of PMOS transistor 14 is coupled to the output 24 of the inverter. The source of PMOS transistor 14 is coupled to VDD 26, and the drain of the PMOS transistor 14 is coupled to the evaluation node 22. PMOS transistor 14 is used to latch in the internal node just after the pre-charge phase.

The gate NMOS transistor 18 is coupled to the clock input "C" 30, and the source of NMOS transistor 18 is coupled to ground. Logic block 20 is arranged between the evaluation node 22 and the drain of NMOS transistor 18. For an OR gate, the logic block 20 may include NMOS transistor 32 and NMOS transistor 34, arranged in a parallel configuration. The gate of NMOS transistor 32 is coupled to a first input signal "A", and the gate of NMOS transistor 34 is coupled to a second input signal "B". The drains of both NMOS transistor 32 and NMOS transistor 34 are coupled to the evaluation node 22, and the sources of both NMOS transistor 32 and NMOS transistor 34 are coupled to the drain of NMOS transistor 18, as shown.

Finally, the gate of PMOS transistor 10 is coupled to the clock input "C". The source of PMOS transistor 10 is coupled to VDD 26, and the drain of PMOS transistor 10 is coupled to the evaluation node 22.

During operation, when the clock input "C" is low, PMOS transistor 10 pre-charges the evaluation node 22. This causes the output 24 of the inverter to go low. Because "C" is low, NMOS transistor 18 is off, which effectively disconnects the logic block 20 from ground. Accordingly, the evaluation node 22 is pre-charged high, with the output 24 of the inverter low.

When the clock input "C" goes high, the circuit enters an "evaluate" phase where the desired logic function is performed. When "C" goes high, PMOS transistor 10 turns off, and NMOS transistor 18 turns on. Because NMOS transistor 18 is on, the source terminals of NMOS transistors 32 and 34 are effectively grounded through NMOS transistor 18. If either "A" or "B" are high, the evaluation node 22 is coupled to ground through either NMOS transistor 32 or NMOS transistor 34, and NMOS transistor 18. Thus, the evaluation node 22 is pulled low if either "A" or "B" (or both) are high. When the evaluation node 22 is pulled low, the output 24 of the inverter goes high. This turns off PMOS transistor 14. Other functions can be provided by changing the arrangement of the NMOS transistors in logic block 20. For example, an AND gate may be provided by including two NMOS transistors in series, rather than in parallel.

A limitation of conventional domino logic circuits is that significant performance inhibitors often exist. For example and referring to FIG. 1, the placement of NMOS transistor 18 in series with the logic transistors 32 and 34 tends to increase the resistance of the path from the evaluation node, through the logic block, and to ground. Accordingly, NMOS transistor 18 may increase the time required to discharge the evaluation node 22 during the evaluation phase.

In addition, PMOS transistor 10 may be required to properly pre-charge the evaluation node 22 during a pre-charge phase. PMOS transistor 10 can add significant capacitance to the evaluation node 22, and thus may also increase the time required to discharge the evaluation node 22 during the evaluation phase.

Finally, NMOS transistor 16, which is part of the inverter, typically must be relatively large to provide a reasonably short pre-charge time. However, the gate capacitance of NMOS transistor 16 can add significant capacitance to the evaluation node 22. As indicated above, this can significantly increase the time required to discharge the evaluation node 22 during the evaluation phase. Each of these performance inhibitors reduce the performance of the circuit. What would be desirable, therefore, is a domino logic circuit and circuit family that has reduced capacitance on the evaluation node for increased circuit performance.

SUMMARY OF THE INVENTION

The present invention provides a domino logic circuit and circuit family that has reduced capacitance on an evaluation node for increased circuit performance. This is preferably accomplished by removing one or both of the clocked transistors of a conventional domino logic circuit (e.g., transistors 10 and 18 of FIG. 1), and providing a single clocked transistor that controls the logic state of the output of the inverter. It has been found that this may: (1) reduce or eliminate the series resistance in line with the logic block; (2) reduce or eliminate the capacitance contributed by the clocked pre-charge transistor (e.g., transistor 10 of FIG. 1) to the evaluation node; and (3) reduce the size and thus the capacitance contributed by one of the transistors of the inverter to the evaluation node of the circuit. Each of these may increase the performance of the circuit.

In an illustrative embodiment, a domino logic circuit is provided that includes an inverter, a pre-charge transistor, a logic block, and a pre-charge control transistor. The inverter has an input and an output. Like prior art domino logic circuits, the input of the inverter corresponds to the evaluation node of the domino logic circuit. The pre-charge transistor is coupled to the evaluation node of the domino logic circuit, and is controlled by the output of the inverter.

That is, the pre-charge transistor may pre-charge the evaluation node when the output of the inverter is in a predetermined pre-charged state. The pre-charge control transistor selectively pulls the output of the inverter to the pre-charged state, when enabled. The pre-charge control transistor is preferably controlled by a clock signal having a pre-charge phase and an evaluation phase.

The logic block is coupled to the evaluation node, and conditionally discharges the evaluation node during the evaluation phase. The logic block is preferably coupled directly between the evaluation node and a power supply terminal, such as VDD or ground. Accordingly, there is little or no resistance in series with the logic block to slow the discharge of the evaluation node 22 during the evaluation phase.

In addition, the capacitance on the evaluation node may be reduced because the clocked pre-charge transistor commonly found in prior art domino logic circuits has been eliminated. The capacitance on the evaluation node may be further reduced because the size of one or both of the transistors of the inverter may be reduced. The size of one or both of the transistors of the inverter may be reduced because the pre-charge control transistor of the present invention now provides the drive to pull the output of the inverter to the pre-charge state during the pre-charge phase of the clock. Accordingly, the transistor of the inverter that is parallel with the pre-charge control transistor need only provide a "keeper" function. As such, the gate capacitance of this transistor may be significantly reduced. Each of these factors may increase the performance of the domino logic circuit, at least during the evaluation phase of operation.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 2:
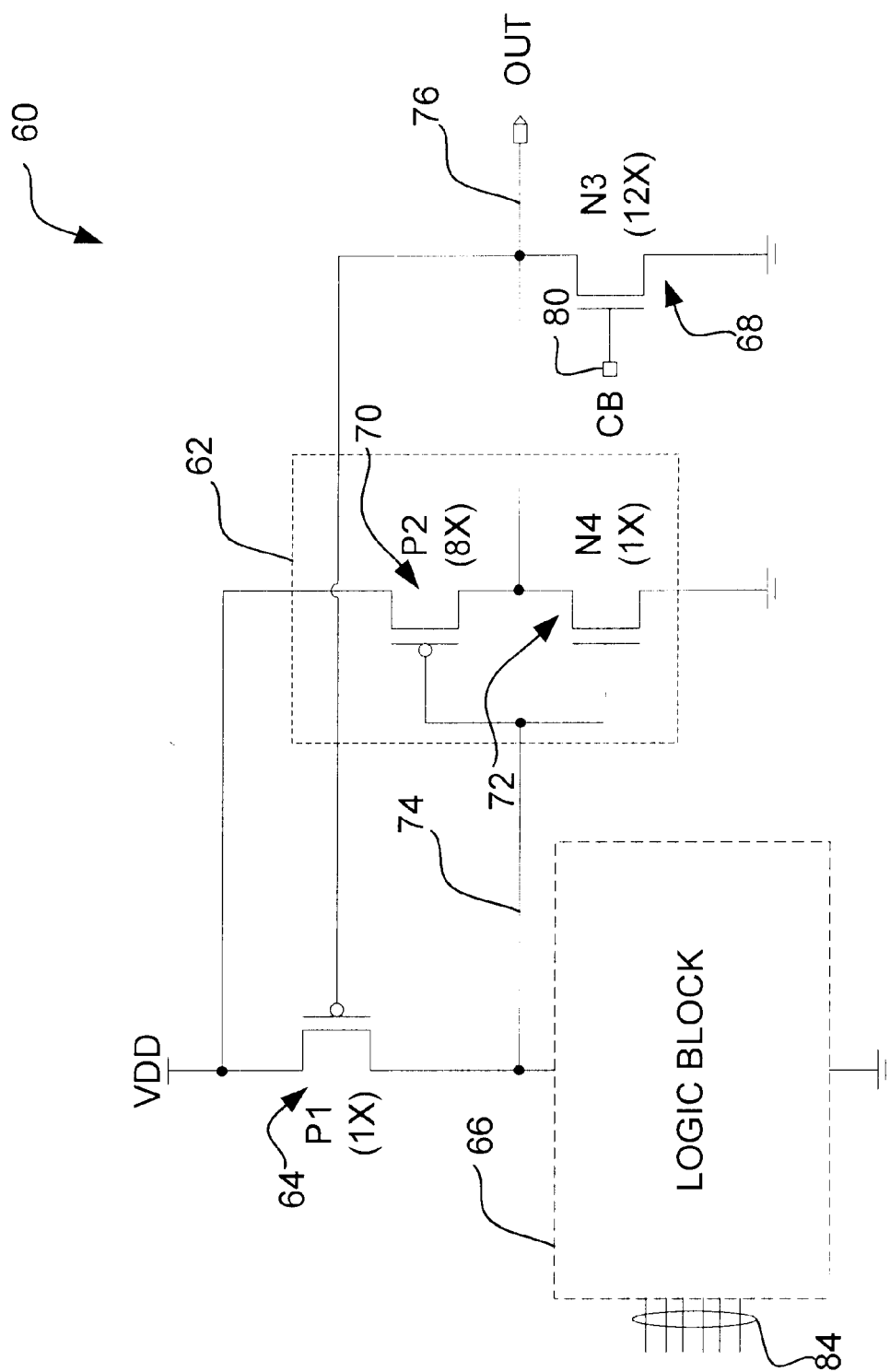
FIG. 2 is a schematic diagram of an illustrative domino logic circuit in accordance with the present invention.

FIG. 2 is a schematic diagram of an illustrative domino logic circuit in accordance with the present invention. The illustrative domino logic circuit is generally shown at 60, and includes an inverter 62, a PMOS pre-charge transistor 64, a logic block 66, and an NMOS pre-charge control transistor 68. The inverter 62 includes a PMOS transistor 70 and an NMOS transistor 72 connected in conventional CMOS inverter configuration. The input of the inverter 62 corresponds to an evaluation node 74 of the domino logic circuit 60.

The drain of the PMOS pre-charge transistor 64 is coupled to the evaluation node 74. The source of the PMOS pre-charge transistor 64 is coupled to VDD, and the gate is coupled to the output 76 of the inverter 62. The PMOS pre-charge transistor 64 pre-charges the evaluation node 74 to VDD when the output 76 of the inverter 62 is low.

The drain of the NMOS pre-charge control transistor 68 is coupled to the output 76 of the inverter 62. The source of the NMOS pre-charge control transistor 68 is coupled to ground, and the gate is coupled to a clock signal "CB" 80 that has a pre-charge phase and an evaluation phase. The NMOS pre-charge control transistor 68 pulls the output 76 of the inverter low when the clock signal "CB" 80 is in the pre-charge phase (e.g., high). This, in turn, causes the PMOS pre-charge transistor 64 to pre-charge the evaluation node 74 to VDD. When the clock signal "CB" is in the evaluation phase (e.g., low), the NMOS pre-charge control transistor 68 is turned off, thereby releasing the output 76 of the inverter 62.

The logic block 66 is coupled between the evaluation node 74 and ground. The logic block 66 conditionally discharges the evaluation node 74 during the evaluation phase of the clock. Because the logic block 66 is coupled directly between the evaluation node 74 and ground, there is little or no resistance in series with the logic block 66 to slow the discharge of the evaluation node 74 during the evaluation phase of the clock. This may significantly increase the performance of the domino logic circuit 60.

The logic block 66 preferably implements a logic function using one or more input signals 84. In one embodiment, the logic block 66 may implement an AND, OR, OR-AND, XOR or other predefined function, as further described below. If the predefined logic function is satisfied, the logic block 66 discharges the evaluation node 74 to ground during the evaluation phase of the clock. This, in turn, causes the output 76 of the inverter to go high.

In the embodiment shown, the logic block 66 is preferably implemented using a logic tree of NMOS transistors. Thus, it may be important to keep one or more of the input signals 84 low during the pre-charge phase of the clock "CB" 80. If some of the input signals 84 are allowed to go high during the pre-charge phase of the clock "CB" 80, a leakage path may be created between VDD and ground, through PMOS pre-charge transistor 64 and logic block 66. This concern is obviated, however, when the input signals 80 are driven by the outputs of other domino logic circuits, including conventional domino logic circuits. For the conventional domino logic circuit shown in FIG. 1, PMOS transistor 10 pulls the evaluation node 22 high, and thus the output 24 low, when the clock signal "C" is in the pre-charge phase (e.g., low). Likewise, for the domino logic circuit shown in FIG. 2, NMOS pre-charge control transistor 68 pulls the output 76 of the inverter 62 low when the clock signal "CB" 80 is in the pre-charge phase (e.g., high).

Figure 1:
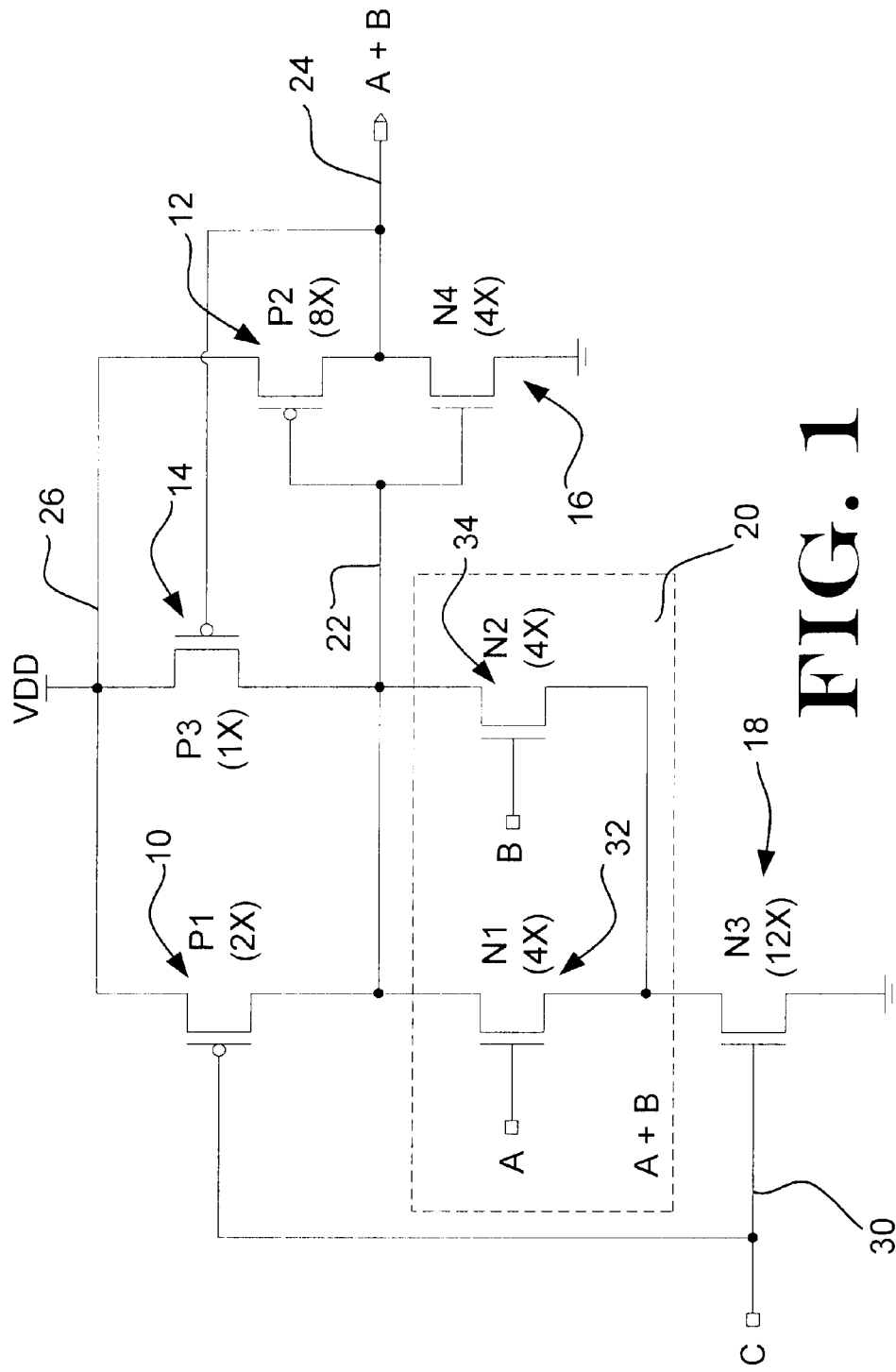
FIG. 1 is a schematic diagram of a conventional domino logic OR gate.

Another advantage of the domino logic circuit of FIG. 2 is that the capacitance on the evaluation node 74 may be reduced relative to the conventional domino logic circuit shown in FIG. 1. For example, the illustrative domino logic circuit of FIG. 2 does not include the clocked pre-charge transistor 10 of FIG. 1. This eliminates the drain capacitance of the clocked pre-charge transistor 10 from the evaluation node 74 of FIG. 2.

Likewise, the size of the NMOS transistor 72 of the inverter 62 may be reduced relative to the NMOS transistor 16 of FIG. 1. In the illustrative embodiment of FIG. 2, the NMOS pre-charge control transistor 68 provides the drive that is required to pull the output 76 of the inverter 62 low during the pre-charge phase of the clock signal "CB" 80. The NMOS transistor 72 thus need only provide a "keeper" function. Accordingly, the size of NMOS transistor 72 may be significantly reduced relative to the size of the NMOS transistor 16 of FIG. 1. In the illustrative diagram, NMOS transistor 72 has a size of 1×, while NMOS transistor 16 of FIG. 1 has a size of 4×. This may significantly reduce the gate capacitance on the evaluation node 74. In addition, performance of the circuit is not significantly compromised during the evaluation phase, because the drain capacitance of the relatively large NMOS pre-charge control transistor 68 is driven by high-drive PMOS transistor 70.

Figure 3:
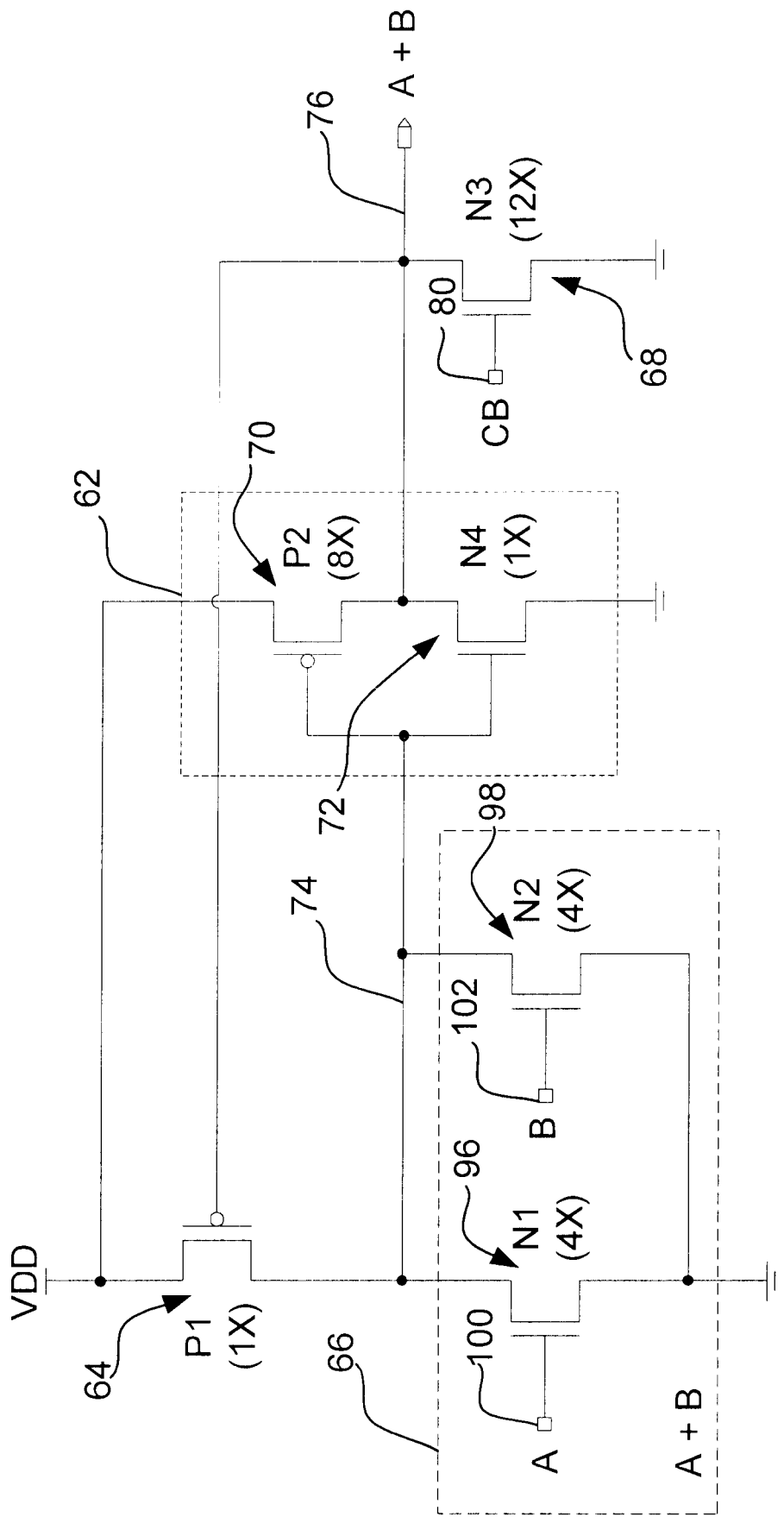
FIG. 3 is a schematic diagram of an illustrative two-input OR gate in accordance with the present invention.

FIG. 3 is a schematic diagram of an illustrative two-input OR gate in accordance with the present invention. The illustrative domino logic circuit is identical to that shown in FIG. 2, except the logic block 66 specifically includes NMOS transistors 96 and 98 implementing an OR function (A OR B). The drain of NMOS transistor 96 is coupled to the evaluation node 74 and the source is coupled directly to ground. Likewise, the drain of NMOS transistor 98 is coupled to the evaluation node 74 and the source is coupled directly to ground. The gate of NMOS transistor 96 is coupled to an input signal A 100, and the gate of NMOS transistor 96 is coupled to an input signal B 102.

During the pre-charge phase of the clock signal "CB" 80 (e.g., high), the NMOS pre-charge control transistor 68 pulls the output 76 of the inverter low. This, in turn, causes the PMOS pre-charge transistor 64 to pre-charge the evaluation node 74 to VDD. Preferably, the input signals A 100 and B 102 are driven by the outputs of one or more other domino logic circuits. As such, input signals A 100 and B 102 will be pulled low during the pre-charge phase of the clock signal "CB" 80, which prevents a leakage path between VDD and ground through PMOS pre-charge transistor 64 and logic block 66.

When the clock signal "CB" 80 is in the evaluation phase (e.g., low), the NMOS pre-charge control transistor 68 is turned off, thereby releasing the output 76 of the inverter 62. The input signal A 100 and input signal B 102 then assume a desired logic state based on the logical function of the overall circuit. If either input signal A 100 or input signal B 102 go high, the corresponding NMOS transistor 96 and 98 will be turned on, thereby discharging the evaluation node 74 to ground. When the evaluation node 74 is pulled to ground, the output 76 of the inverter 62 is pulled high. If neither the input signal A 100 or input signal B 102 go high, the evaluation node 74 remains high, which keeps the output 76 of the inverter 62 low.

Because the NMOS transistors 96 and 98 of the logic block 66 are coupled directly between the evaluation node 74 and ground, there is no resistance in series with NMOS transistors 96 and 98 to slow the discharge of the evaluation node 74 during the evaluation phase of the clock. As indicated above, this may significantly increase the performance of the domino logic circuit relative to the conventional domino logic circuit shown in FIG. 1.

Figure 4:
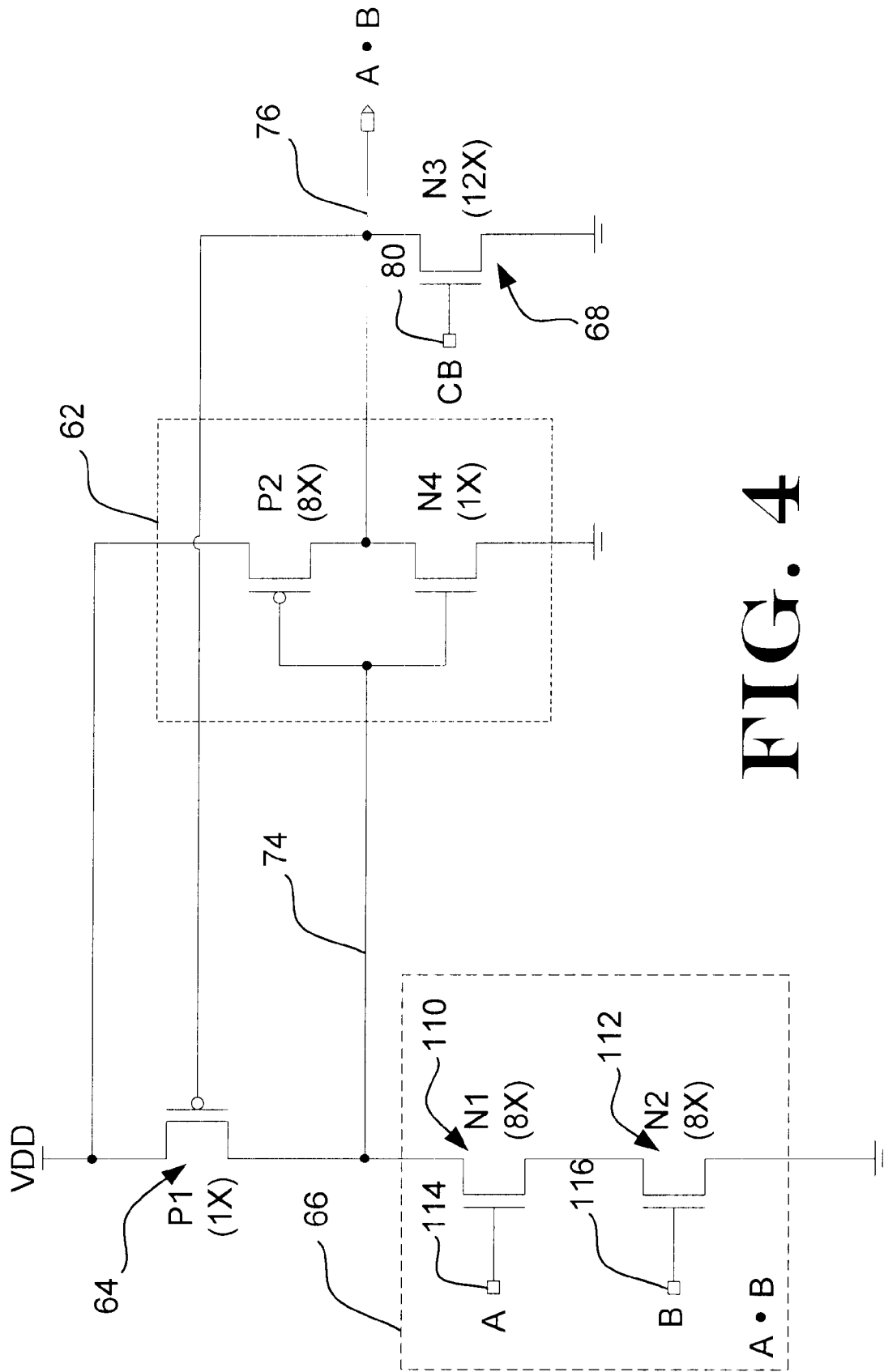
FIG. 4 is a schematic diagram of an illustrative two-input AND gate in accordance with the present invention.

FIG. 4 is a schematic diagram of an illustrative two-input AND gate in accordance with the present invention. The illustrative domino logic circuit is identical to that shown in FIG. 2, except the logic block 66 specifically includes NMOS transistors 110 and 112 implementing an AND function (A AND B). The drain of NMOS transistor 110 is coupled to the evaluation node 74. The drain of NMOS transistor 112 is coupled to the drain of NMOS transistor 110, and the source is coupled directly to ground. The gate of NMOS transistor 110 is coupled to an input signal A 114, and the gate of NMOS transistor 112 is coupled to an input signal B 116.

During the pre-charge phase of the clock signal "CB" 80 (e.g., high), the NMOS pre-charge control transistor 68 pulls the output 76 of the inverter low. This, in turn, causes the PMOS pre-charge transistor 64 to pre-charge the evaluation node 74 to VDD. Preferably, the input signals A 114 and B 116 are driven by the outputs of one or more other domino logic circuits. As such, input signals A 114 and B 116 will be pulled low during the pre-charge phase of the clock signal "CB" 80, which prevents a leakage path between VDD and ground through PMOS pre-charge transistor 64 and logic block 66. It is recognized that only one of the input signals A 114 or B 116 need to be low during the pre-charge phase of the clock signal "CB" 80 to prevent this leakage path.

When the clock signal "CB" 80 is in the evaluation phase (e.g., low), the NMOS pre-charge control transistor 68 is turned off, thereby releasing the output 76 of the inverter 62. The input signal A 114 and input signal B 116 then assume a desired logic state based on the logical function of the overall circuit. If both input signal A 114 and input signal B 116 go high, the corresponding NMOS transistors 110 and 112 will be turned on, thereby discharging the evaluation node 74 to ground. When the evaluation node 74 is pulled to ground, the output 76 of the inverter 62 is pulled high. If input signals A 112 and B 116 do not both go high, the evaluation node 74 remains high, which keeps the output 76 of the inverter 62 low.

Figure 5:
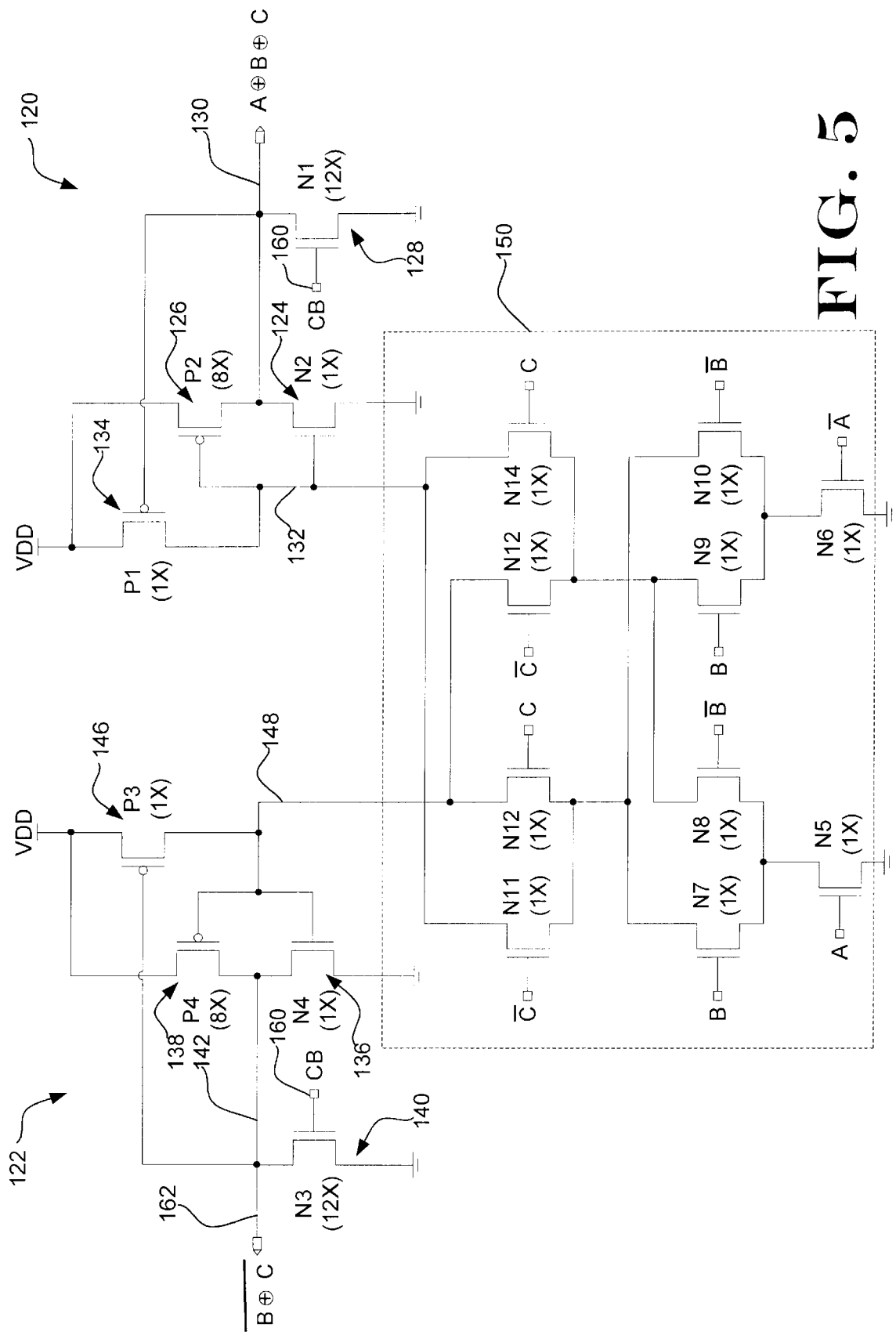
FIG. 5 is a schematic diagram of an illustrative three-input XOR/XNOR gate in accordance with the present invention.

FIG. 5 is a schematic diagram of an illustrative three-input XOR/XNOR gate in accordance with the present invention. This illustrative embodiment includes a first domino logic circuit 120 and a second domino logic circuit 122, both sharing a common logic block 150. The first domino logic circuit 120 provides the EXCLUSIVE-OR (A, B, C) function, and the second domino logic circuit 122 provides the EXCLUSIVE-NOR (A, B, C) function.

Like above, the first domino logic circuit 120 includes an inverter formed by NMOS transistor 124 and PMOS transistor 126, a PMOS pre-charge transistor 134, and an NMOS pre-charge control transistor 128. The input of the inverter corresponds to the evaluation node 132 of the first domino logic circuit 120. Likewise, the second domino logic circuit 122 includes an inverter formed by NMOS transistor 136 and PMOS transistor 138, a PMOS pre-charge transistor 146, and an NMOS pre-charge control transistor 140. The input of the inverter corresponds to the evaluation node 148 of the second domino logic circuit 122.

The logic block 150 includes a logic tree of NMOS transistors forming both the XOR and XNOR functions. During the evaluation phase of the clock signal "CB" 160, when the input signals A, B and C satisfy the XOR function, the evaluation node 148 of the second domino logic circuit 122 is pulled low. This, in turn, causes the output 162 of the second domino logic circuit 122 to go high. Likewise, when the input signals A, B and C satisfy the XNOR function, the evaluation node 132 of the first domino logic circuit 120 is pulled low. This, in turn, causes the output 164 of the first domino logic circuit to go high. The XOR/XNOR gate shown in FIG. 5 is one illustrative example of a more complex gate that can be implemented using the domino logic circuit of the present invention.

Figure 6:
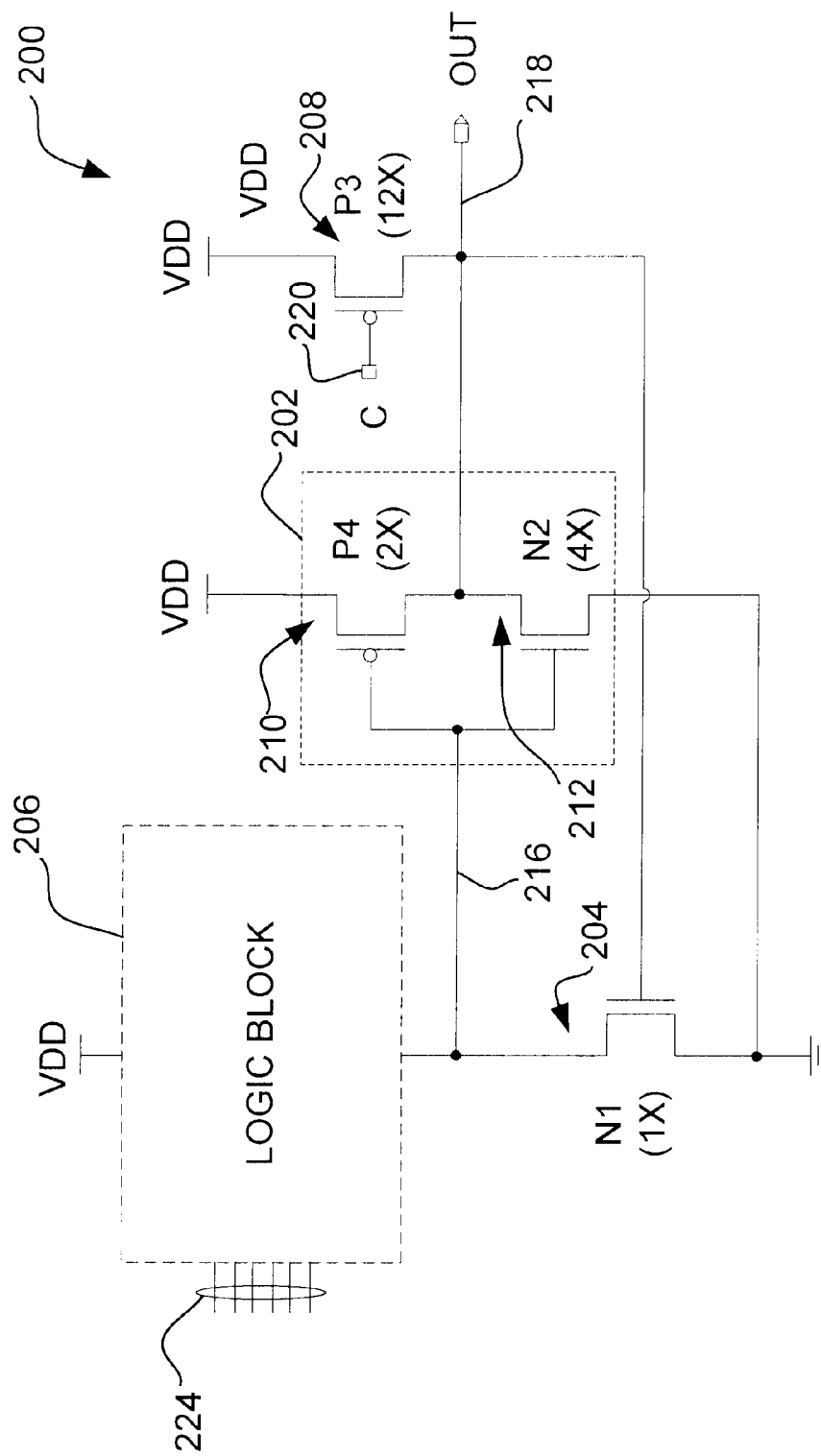
FIG. 6 is a schematic diagram of another illustrative domino logic circuit in accordance with the present invention with the logic block coupled to VDD.

FIG. 6 is a schematic diagram of another illustrative domino logic circuit in accordance with the present invention with the logic block coupled to VDD. In this embodiment, the logic block includes a logic tree of PMOS transistors. While this embodiment may not produce the speed of the embodiment shown in FIG. 2, it may be useful in certain applications.

The illustrative domino logic circuit is generally shown at 200, and includes an inverter 202, an NMOS pre-charge transistor 204, a logic block 206, and a PMOS pre-charge control transistor 208. The inverter 202 includes a PMOS transistor 210 and an NMOS transistor 212 connected in conventional CMOS inverter configuration. The input of the inverter 202 corresponds to an evaluation node 216 of the domino logic circuit 200. The drain of the NMOS pre-charge transistor 204 is coupled to the evaluation node 216. The source of the NMOS pre-charge transistor 204 is coupled to ground, and the gate is coupled to the output 218 of the inverter 202. The NMOS pre-charge transistor 204 pre-charges the evaluation node 216 to ground when the output 218 of the inverter 202 is high.

The drain of the PMOS pre-charge control transistor 208 is coupled to the output 218 of the inverter 202. The source of the PMOS pre-charge control transistor 208 is coupled to VDD, and the gate is coupled to a clock signal "C" 220 that has a pre-charge phase and an evaluation phase. The PMOS pre-charge control transistor 208 pulls the output 218 of the inverter 202 high when the clock signal "C" 220 is in the pre-charge phase (e.g., low). This, in turn, causes the NMOS pre-charge transistor 204 to pre-charge the evaluation node 216 to ground. When the clock signal "C" 220 is in the evaluation phase (e.g., high), the PMOS pre-charge control transistor 208 is turned off, thereby releasing the output 218 of the inverter 202.

The logic block 206 is coupled between the evaluation node 216 and VDD. The logic block 206 conditionally discharges the evaluation node 216 to VDD during the evaluation phase of the clock. Because the logic block 206 is coupled directly between the evaluation node 216 and VDD, there is little or no resistance in series with the logic block 206 to slow the discharge of the evaluation node 216 during the evaluation phase of the clock. This may significantly increase the performance of the domino logic circuit 200.

The logic block 206 preferably implements a logic function using one or more input signals 224. In one embodiment, the logic block 206 may implement an AND, OR, OR-AND, XOR or other predefined function, as further described below. If the predefined logic function is satisfied, the logic block 206 will discharge the evaluation node 74 to VDD during the evaluation phase of the clock signal "C" 220. This, in turn, causes the output 218 of the inverter 202 to go low.

Because the logic block 206 is preferably implemented using a logic tree of PMOS transistors, it may be important to keep one or more of the input signals 224 high during the pre-charge phase of the clock "C" 220. If some of the input signals 224 are allowed to go low during the pre-charge phase of the clock "C" 220, a leakage path may be created between VDD and ground, through NMOS pre-charge transistor 204 and logic block 206. This concern is obviated, however, when the input signals 224 are driven by the outputs of other like domino logic circuits. For the domino logic circuit shown in FIG. 6, for example, PMOS pre-charge control transistor 208 pulls the output 218 of the inverter 202 high when the clock signal "C" 220 is in the pre-charge phase (e.g., low). Thus, when the output 218 is provided to the input of a second like domino logic circuit, the input of the second domino logic circuit is high during the pre-charge phase of the clock "C" 220.

Figure 7:
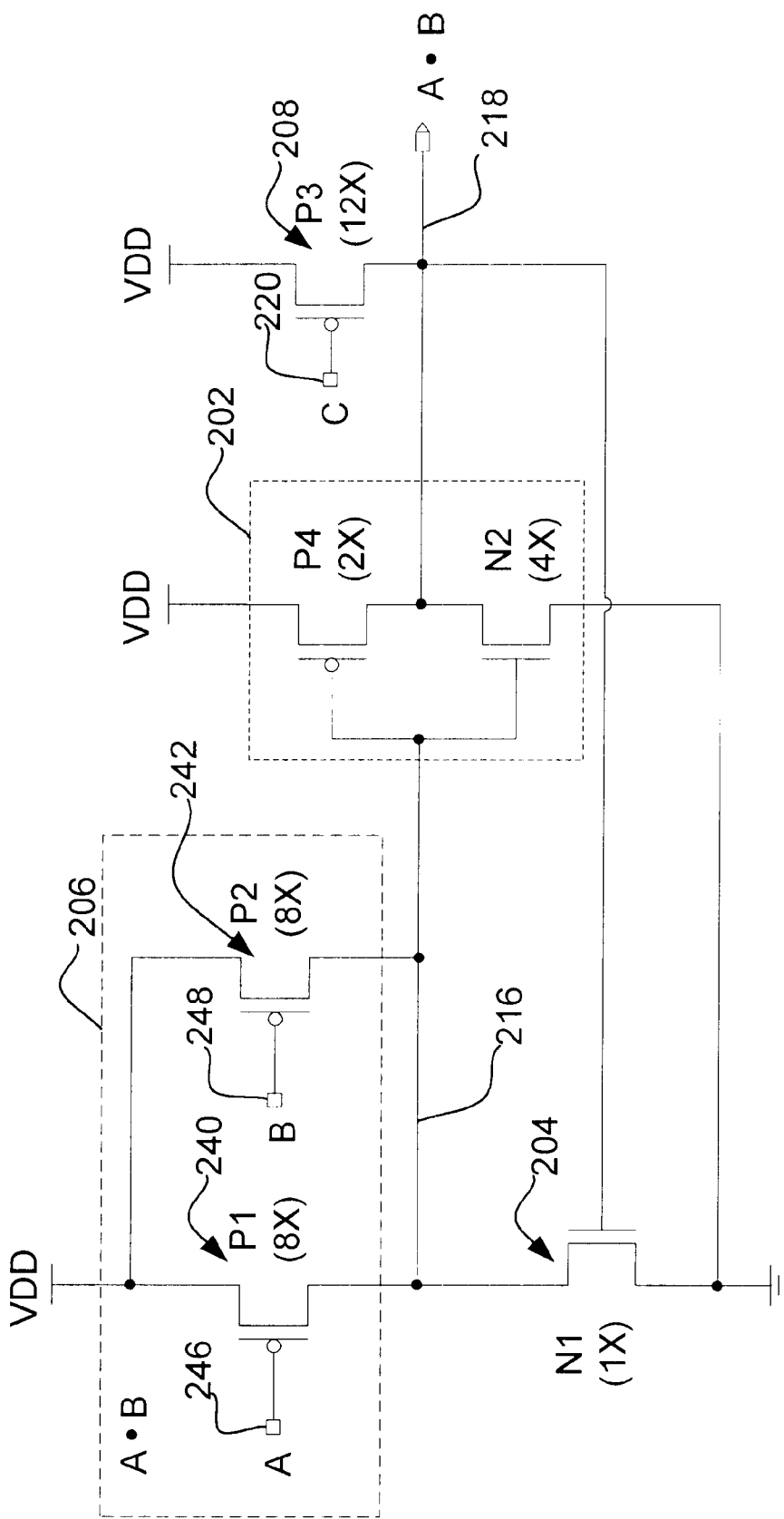
FIG. 7 is a schematic diagram of an illustrative two-input AND gate in accordance with the domino logic circuit of FIG. 6.

FIG. 7 is a schematic diagram of an illustrative two-input AND gate in accordance with the domino logic circuit of FIG. 6. The illustrative domino logic circuit is identical to that shown in FIG. 6, except the logic block 206 specifically includes PMOS transistors 240 and 242 implementing an AND function (A AND B). The drain of PMOS transistor 240 is coupled to the evaluation node 216 and the source is coupled directly to VDD. Likewise, the drain of PMOS transistor 242 is coupled to the evaluation node 216 and the source is coupled directly to VDD. The gate of PMOS transistor 240 is coupled to an input signal A 246, and the gate of PMOS transistor 242 is coupled to an input signal B 248.

During the pre-charge phase of the clock signal "C" 220 (e.g., low), the PMOS pre-charge control transistor 208 pulls the output 218 of the inverter 202 high. This, in turn, causes the NMOS pre-charge transistor 204 to pre-charge the evaluation node 216 to ground. Preferably, the input signals A 246 and B 248 are driven by the outputs of one or more other like domino logic circuits. As such, input signals A 246 and B 248 will be pulled high during the pre-charge phase of the clock signal "C" 220, which prevents a leakage path between VDD and ground through NMOS pre-charge transistor 204 and logic block 206.

When the clock signal "C" 220 is in the evaluation phase (e.g., high), the PMOS pre-charge control transistor 208 is turned off, thereby releasing the output 218 of the inverter 202. Input signal A 246 and input signal B 248 then assume a desired logic state based on the logical function of the overall circuit. If either input signal A 246 or input signal B 248 go low, the corresponding PMOS transistor 240 and 242 will be turned on, thereby discharging the evaluation node 216 to VDD. When the evaluation node 216 is pulled to VDD, the output 218 of the inverter 202 is pulled low. When both the input signal A 246 and input signal B 248 remain high, the evaluation node 216 remains low, which keeps the output 218 of the inverter 202 high. Thus, an AND function is formed.

Because the PMOS transistors 240 and 242 of the logic block 206 are coupled directly between the evaluation node 216 and VDD, there is no resistance in series with PMOS transistors 240 and 242 to slow the discharge of the evaluation node 216 during the evaluation phase of the clock. As indicated above, this may significantly increase the performance of the domino logic circuit.

Figure 8:
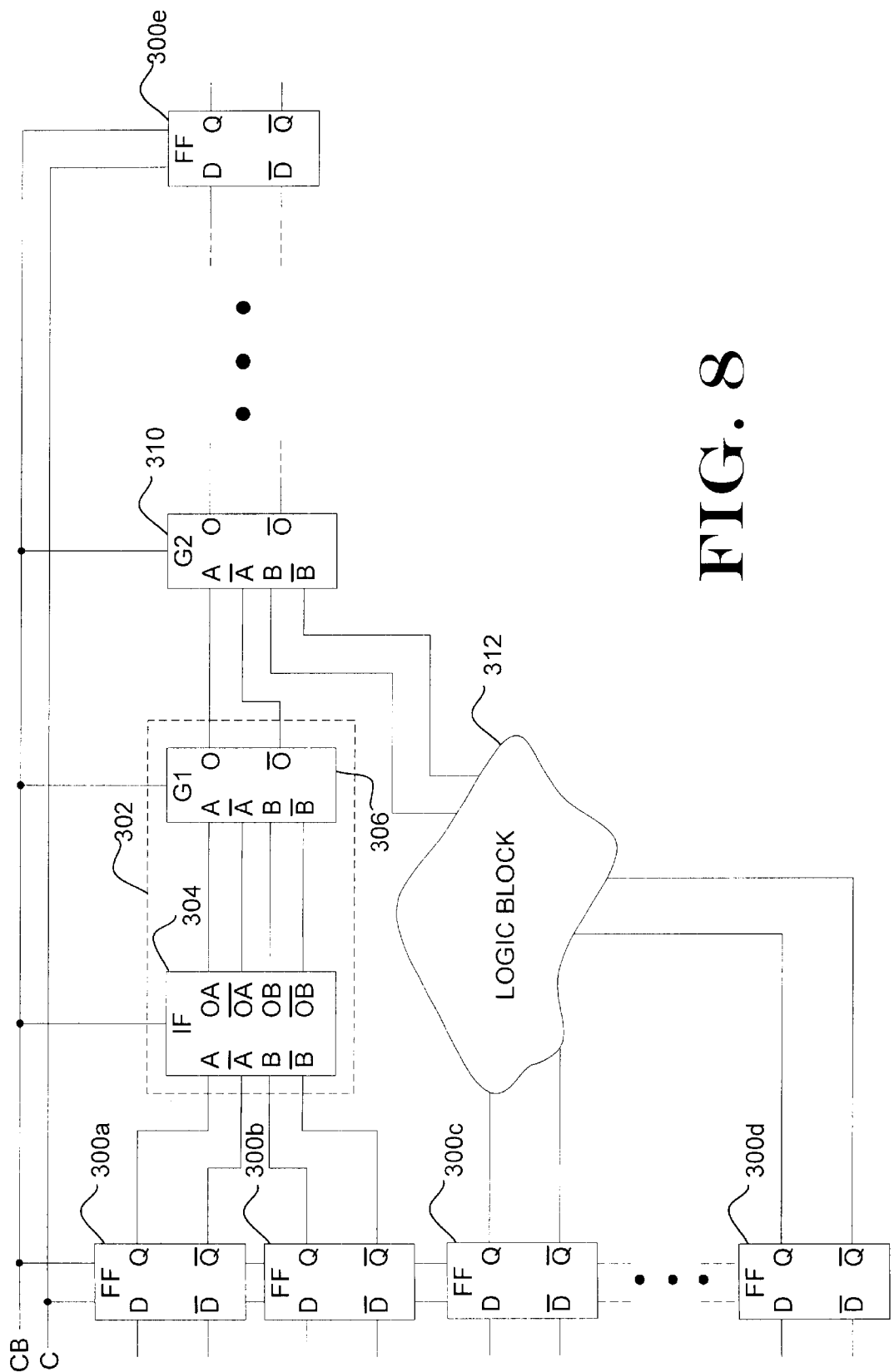
FIG. 8 is a schematic diagram of an illustrative delay path in accordance with the present invention.

FIG. 8 is a schematic diagram of an illustrative delay path in accordance with the present invention. A number of registers are shown at 300a, 300b, 300c, 300d, and 300e. For maximum performance, registers 300a, 300b, 300c, 300d, and 300e are preferably constructed in accordance with co-pending U.S. patent application Ser. No. 09/420,684 entitled "HIGH SPEED LATCH AND FLIP-FLOP", which is incorporated herein by reference. It is recognized, however, that other register configurations may be used.

Registers 300a, 300b, 300c, 300d, and 300e may provide both true and complement outputs. In the illustrative diagram, registers 300a and 300b provide true and complement outputs to the inputs of a first domino logic stage 302. The true and complement outputs of the first domino logic stage 302 are then provided to the true and complement inputs of a second domino logic stage 310. Other inputs of the second domino logic stage 310 may be provided by a logic block 312, as shown. This may continue until the outputs of a last domino logic stage are provided to the inputs of register 300e. Preferably, selected domino logic stages are constructed in accordance with the present invention, such as that shown in FIG. 2 above.

In operation, when the clock signal "CB" is in a pre-charge phase (e.g., high), the evaluation node of each of the domino logic stages is pre-charged high. When the clock "CB" switches to the evaluation phase, the input signals provided to the first domino logic stage 302 are evaluated in order to provide output signals to the second domino logic stage 310. These output signals are then evaluated to provide an output signal for propagation to and evaluation by yet another stage in the circuit. Thus, a "domino" effect is achieved whereby signals are sequentially propagated through an array of "stages" or "domino blocks", and each successive stage performs an evaluation of the input condition until a final output is provided at a final output stage.

Domino logic circuits may be arranged so that signals can propagate through the various stages without being separately clocked at each stage. Accordingly, a domino arrangement allows a signal to be processed through a relatively complex logic function during a single clock cycle. This ability of a domino circuit obviates the need for plural clock cycles to process the input signals, and also decreases the overall processing time of the logic function.

If registers 300a, 300b, 300c and 300d pull the true and complement outputs low when the clock signal "CB" is high, then the first domino logic stage 302 may be simply constructed in accordance with, for example, the domino logic circuit of FIG. 2. If, however, registers 300a, 300b, 300c and 300d do not pull the true and complement outputs low when the clock signal "CB" is high, then the first domino logic stage 302 may need to be specially constructed. For example, and in a first embodiment, the first domino logic stage 302 may be a conventional domino logic stage, such as that shown in FIG. 1. As shown in FIG. 1, inputs A and B do not need to be in any specific state during the pre-charge phase of the clock because the sources of NMOS transistors 32 and 34 are effectively disconnected from ground. Therefore, no leakage paths exist.

In an alternative embodiment, the first domino logic stage 302 may include an interface block 304 coupled to a domino logic circuit 306 (such as that shown in FIG. 2). The interface block 304 may pull the inputs of the domino logic circuit 306 low when the clock signal "CB" is in the pre-charge phase (e.g., high). This will prevent any leakage paths through domino logic circuit 306, as described above.

Other embodiments for pulling the inputs of the first domino logic stage 302 low during the pre-charge phase of the clock may be similarly constructed.

Having thus described the preferred embodiments of the present invention, those of skill in the art will readily appreciate that the teachings found herein may be applied to yet other embodiments within the scope of the claims hereto attached.

What is claimed is:

1. A domino logic circuit comprising:

an inverter having an input and an output;

a logic block having one or more n-channel transistors that provide a desired logic function between the input of the inverter and ground;

at least one p-channel transistor for supplying a pre-charging current to the input of the inverter;

the at least one p-channel transistor having a source, a drain, and a gate, the source of the at least one p-channel transistor being coupled to a power supply voltage, the drain of the at least one p-channel transistor being coupled to the input of the inverter, and the gate of the at least one p-channel transistor being coupled to the output of the inverter;

wherein substantially all of the pre-charging current flows through the at least one p-channel transistor; and an n-channel transistor having a source, a drain and a gate, the source of the n-channel transistor being coupled to ground, the drain of the n-channel transistor being coupled to the output of the inverter, and the gate of the n-channel transistor being coupled to a clock signal.

2. A domino logic circuit according to claim 1, wherein the logic block comprises:

a first n-channel transistor having a source, a drain and a gate, the source of the first n-channel transistor is coupled to ground, the drain of the first n-channel transistor is coupled to the input of the inverter, and the gate of the first n-channel transistor is coupled to a first input signal; and a second n-channel transistor having a source, a drain and a gate, the source of the second n-channel transistor is coupled to ground, the drain of the second n-channel transistor is coupled to the input of the inverter, and the gate of the second n-channel transistor is coupled to a second input signal.

3. A domino logic circuit according to claim 1, wherein the logic block comprises:

a first n-channel transistor having a source, a drain and a gate, the source of the first n-channel transistor is coupled to ground, and the gate of the first n-channel transistor is coupled to a first input signal; and a second n-channel transistor having a source, a drain and a gate, the source of the second n-channel transistor is coupled to the drain of the first n-channel transistor, the drain of the second n-channel transistor is coupled to the input of the inverter, and the gate of the second n-channel transistor is coupled to a second input signal.

4. A dynamic logic circuit comprising:

an inverter having an input and an output;

a logic block having one or more n-channel transistors that provide a desired logic function between the input of the inverter and ground; and at least one p-channel transistor for supplying a pre-charging current to the input of the inverter;

the at least one p-channel transistor having a source, a drain, and a gate, the source being coupled to a power supply voltage, the drain being coupled to the input of the inverter, and the gate being coupled to the output of the inverter;

wherein substantially all of the pre-charging current flows through the at least one p-channel transistor.

5. The dynamic logic circuit of claim 4, further comprising:

an n-channel transistor having a source, a drain, and a gate, the source of the n-channel transistor being coupled to ground, the drain of the n-channel transistor being coupled to the output of the inverter, and the gate of the n-channel transistor being coupled to a clock signal.

6. A dynamic logic circuit comprising:

an inverter having an input and an output;

a logic block having one or more p-channel transistors that provide a desired logic function between the input of the inverter and ground; and at least one n-channel transistor for supplying a pre-charging current to the input of the inverter;

the at least one n-channel transistor having a source, a drain, and a gate, the source being coupled to ground, the drain being coupled to the input of the inverter, and the gate being coupled to the output of the inverter;

wherein substantially all of the pre-charging current flows through the at least one n-channel transistor.

7. The dynamic logic circuit of claim 6, further comprising:

a p-channel transistor having a source, a drain, and a gate, the source of the p-channel transistor being coupled to a power supply voltage, the drain of the p-channel transistor being coupled to the output of the inverter, and the gate of the p-channel transistor being coupled to a clock signal.

* * * * *